US009338928B2

(12) United States Patent
Lehman

(10) Patent No.: US 9,338,928 B2
(45) Date of Patent: May 10, 2016

(54) OPTIMIZING FREE COOLING OF DATA CENTERS THROUGH WEATHER-BASED INTELLIGENT CONTROL

(75) Inventor: Bret W. Lehman, Raleigh, NC (US)

(73) Assignee: International Business Machines Corporation, Armonk, NY (US)

(*) Notice: Subject to any disclaimer, the term of this patent is extended or adjusted under 35 U.S.C. 154(b) by 480 days.

(21) Appl. No.: 13/293,800

(22) Filed: Nov. 10, 2011

(65) Prior Publication Data

US 2013/0124003 A1 May 16, 2013

(51) Int. Cl.
*G05D 23/19* (2006.01)
*H05K 7/20* (2006.01)

(52) U.S. Cl.
CPC .................................. *H05K 7/20836* (2013.01)

(58) Field of Classification Search
CPC .......... H05K 7/20209; H05K 7/20281; H05K 7/20381; H05K 7/20536; H05K 7/20572–7/2059; H05K 7/20654; H05K 7/2069; H05K 7/207; H05K 7/20709–7/20836; G06F 1/206; G05D 23/1917; Y02B 30/542
USPC ...................................... 700/18, 31, 276–278
See application file for complete search history.

(56) References Cited

U.S. PATENT DOCUMENTS

| 6,026,650 | A  | * | 2/2000  | Beaverson et al. .............. 62/126 |
| 6,178,362 | B1 | * | 1/2001  | Woolard et al. ................ 700/295 |
| 8,042,352 | B2 |   | 10/2011 | Deangelis |
| 8,151,578 | B1 | * | 4/2012  | Morales ................ F24F 3/0442 62/259.2 |
| 8,606,374 | B2 | * | 12/2013 | Fadell et al. ..................... 700/31 |
| 8,630,741 | B1 | * | 1/2014  | Matsuoka et al. ............. 700/276 |
| 8,630,742 | B1 | * | 1/2014  | Stefanski et al. .............. 700/278 |
| 8,721,409 | B1 | * | 5/2014  | Morales ............. H05K 7/20209 454/184 |
| 2002/0093788 | A1 | * | 7/2002 | Rothschild ..................... 361/685 |
| 2003/0056526 | A1 | * | 3/2003 | Holmes et al. .................. 62/156 |
| 2004/0050079 | A1 | * | 3/2004 | Holmes et al. .................. 62/187 |

(Continued)

FOREIGN PATENT DOCUMENTS

WO 2010/017429 a2 11/2010

OTHER PUBLICATIONS

Patents Act 1997: Search Report under Section 17 for Application No. GB1217778.8 dated Feb. 4, 2013.

(Continued)

*Primary Examiner* — M. N. Von Buhr
(74) *Attorney, Agent, or Firm* — Edward J. Lenart; John R. Pivnichny; Kennedy Lenart Spraggins LLP

(57) ABSTRACT

Optimizing free cooling of data centers through weather-based intelligent control, including: receiving predictive weather information for the data center's location, wherein the predictive weather information includes information describing expected future weather conditions at the data center's location; receiving a predetermined target inlet air flow temperature for computing components in the data center; receiving excursion information describing acceptable temporary operating conditions during which the predetermined target inlet air flow temperature for computing components in the data center is higher than the sustainable inlet air flow temperature for computing components in the data center; and determining a free air cooling schedule in dependence upon the predictive weather information and the excursion information, the free air cooling schedule specifying periods of time during which cooling is provided with free air.

16 Claims, 3 Drawing Sheets

(56) References Cited

U.S. PATENT DOCUMENTS

| | | | |
|---|---|---|---|
| 2005/0088137 A1* | 4/2005 | Cohen et al. | 318/806 |
| 2009/0210096 A1* | 8/2009 | Stack | F24F 11/0009 700/278 |
| 2010/0154448 A1* | 6/2010 | Hay | G06F 1/20 62/175 |
| 2010/0211224 A1* | 8/2010 | Keeling et al. | 700/277 |
| 2011/0046790 A1* | 2/2011 | Miller et al. | 700/276 |
| 2011/0083824 A1* | 4/2011 | Rogers | H05K 7/20745 165/80.2 |
| 2011/0100045 A1* | 5/2011 | Carlson | 62/259.2 |
| 2011/0100618 A1* | 5/2011 | Carlson | 165/287 |
| 2011/0138708 A1* | 6/2011 | Chazelle | E04H 1/06 52/173.1 |
| 2011/0239671 A1 | 10/2011 | Malone et al. | |
| 2012/0125028 A1* | 5/2012 | Keisling | H05K 7/20827 62/228.1 |

OTHER PUBLICATIONS

Pacific Gas and Electric Company; "High Performance Data Centers: A Design Guidelines Sourcebook", http://hightech.lbl.gov [online] Jan. 2006, [accessed online Nov. 3, 2011], URL: http://hightech.lbl.gov/documents/data_centers/06_datacenters-pge.pdf.

* cited by examiner

OPTIMIZING FREE COOLING OF DATA CENTERS THROUGH WEATHER-BASED INTELLIGENT CONTROL

BACKGROUND OF THE INVENTION

1. Field of the Invention

The field of the invention is data processing, or, more specifically, methods, apparatus, and products for optimizing free cooling of data centers through weather-based intelligent control.

2. Description of Related Art

Modern computing systems include computing components that frequently generate high levels of heat during operation. Because high levels of heat can damage computing components and degrade the performance of computing systems, the need for cooling technologies to cool computing systems has increased. Modern cooling technologies are typically electrically powered. As the burden placed on modern cooling systems has increased, the amount of electricity required to power such modern computing systems has also risen, thereby increasing the costs associated with cooling modern computing systems.

SUMMARY OF THE INVENTION

Methods, apparatus, and products for optimizing free cooling of data centers through weather-based intelligent control, including: receiving, by a free cooling maximization module, predictive weather information for the data center's location, wherein the predictive weather information includes information describing expected future weather conditions at the data center's location; receiving, by the free cooling maximization module, a predetermined target inlet air flow temperature for computing components in the data center; receiving, by the free cooling maximization module, excursion information describing acceptable temporary operating conditions during which the predetermined target inlet air flow temperature for computing components in the data center is higher than the sustainable inlet air flow temperature for computing components in the data center; and determining, by the free cooling maximization module, a free air cooling schedule in dependence upon the predictive weather information and the excursion information, the free air cooling schedule specifying periods of time during which cooling is provided with free air.

The foregoing and other objects, features and advantages of the invention will be apparent from the following more particular descriptions of example embodiments of the invention as illustrated in the accompanying drawings wherein like reference numbers generally represent like parts of example embodiments of the invention.

DETAILED DESCRIPTION OF EXAMPLE EMBODIMENTS

Figure 1:
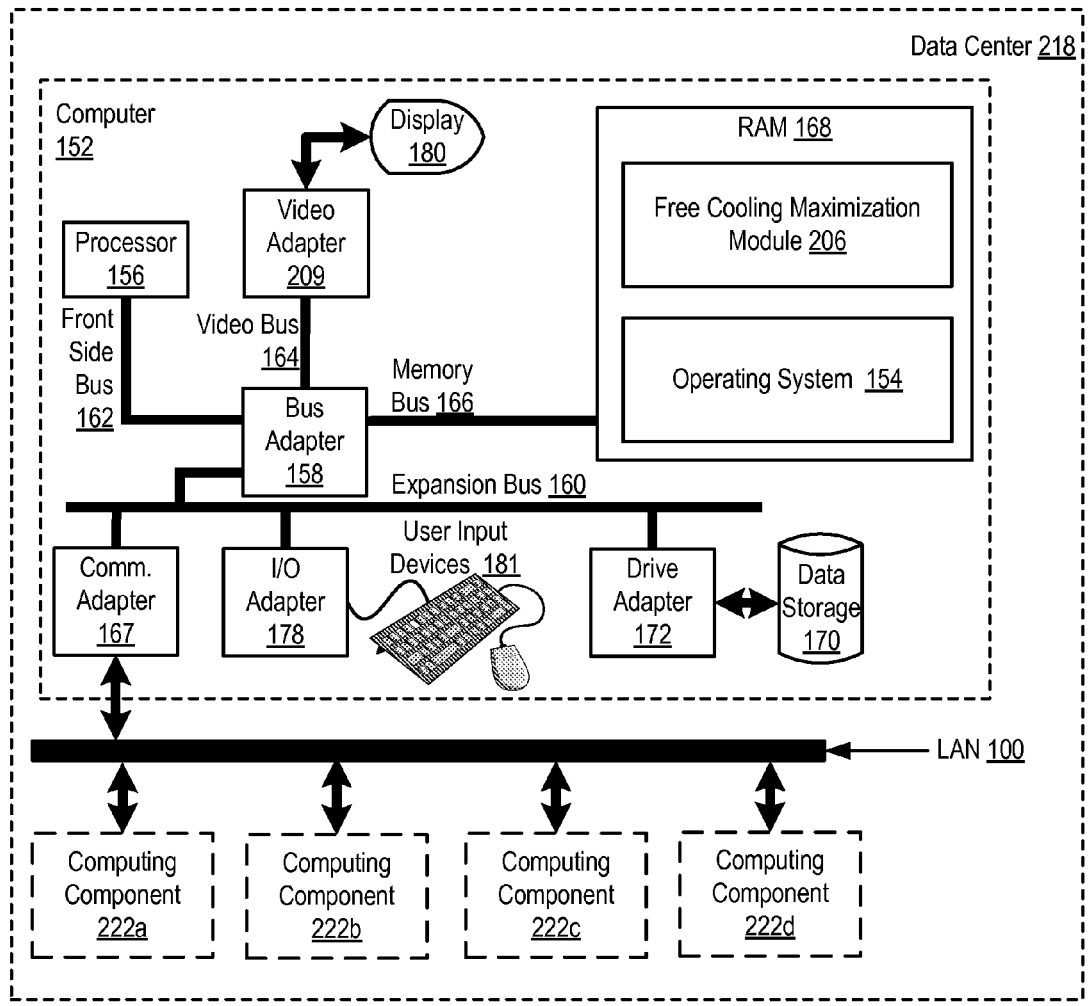
FIG. 1 sets forth a block diagram of automated computing machinery comprising an example computer useful in optimizing free cooling of data centers through weather-based intelligent control according to embodiments of the present invention FIG. 2 sets forth a flow chart illustrating an example method for optimizing free cooling of data centers through weather-based intelligent control according to embodiments of the present invention FIG. 3 sets forth a flow chart illustrating a further example method for optimizing free cooling of data centers through weather-based intelligent control according to embodiments of the present invention

Example methods, apparatus, and products for optimizing free cooling of data centers through weather-based intelligent control in accordance with the present invention are described with reference to the accompanying drawings, beginning with FIG. 1. Optimizing free cooling of data centers through weather-based intelligent control in accordance with the present invention is generally implemented with computers, that is, with automated computing machinery. For further explanation, therefore, FIG. 1 sets forth a block diagram of automated computing machinery comprising an example computer (152) useful in optimizing free cooling of data centers through weather-based intelligent control according to embodiments of the present invention. The computer (152) of FIG. 1 includes at least one computer processor (156) or 'CPU' as well as random access memory (168) ('RAM') which is connected through a high speed memory bus (166) and bus adapter (158) to processor (156) and to other components of the computer (152).

Stored in RAM (168) is a free cooling maximization module (206), a module of computer program instructions improved for optimizing free cooling of data centers (218) through weather-based intelligent control according to embodiments of the present invention. 'Free cooling,' as the term in used here, refers to cooling techniques in which low external air temperatures are used to assist in cooling operations. That is, rather than using electrically powered air conditioning systems exclusively, free cooling techniques make use of cool air outside of a data center (218) to cool computing components (222a, 222b, 222c, 222d) within the data center (218). Free cooling technologies can use water-side economizers in which water is cooled by cool air outside of a data center (218) and used in air conditioning efforts inside the data center (218). Free cooling technologies can also use air-side economizers in which cool air outside of a data center (218) is used in air conditioning efforts inside the data center (218).

The free cooling maximization module (206) of FIG. 1 is configured to receive predictive weather information for the data center's location. The predictive weather information includes information describing expected future weather conditions at the location of the data center (218). The predictive weather information (202) may include, for example, the expected temperature at various points in time at the location of the data center (218), the expected humidity level at various points in time at the location of the data center (218), and so on. The predictive weather information may be embodied, for example, as a weather forecast for the data center's location that includes information describing expected weather conditions over a period of time, where the expected weather conditions over a period of time are generated using meteorological techniques.

The free cooling maximization module (206) of FIG. 1 is also configured to receive a predetermined target inlet air flow temperature for computing components (222a, 222b, 222c, 222d) in the data center (218). The predetermined target inlet air flow temperature for computing components (222a, 222b, 222c, 222d) in the data center (218) may be received from a manufacturer of the computing components (222a, 222b, 222c, 222d). The predetermined target inlet air flow temperature for computing components (222a, 222b, 222c, 222d) in the data center (218) represents an ideal temperature of air that will be introduced into the data center (218) to cool the computing components (222a, 222b, 222c, 222d). Air may be introduced into the data center (218) to cool the computing components (222a, 222b, 222c, 222d), for example, through the use of heating, ventilation, and air conditioning ('HVAC') system.

The free cooling maximization module (206) of FIG. 1 is also configured to receive excursion information. The excursion information of FIG. 1 is information describing acceptable temporary operating conditions during which the inlet air flow temperature for computing components (222a, 222b, 222c, 222d) in the data center (218) is higher than the predetermined target inlet air flow temperature for computing components (222a, 222b, 222c, 222d) in the data center (218). Consider an example in which the predetermined target inlet air flow temperature for computing components (222a, 222b, 222c, 222d) in the data center (218) is 70 degrees Fahrenheit. In such an example, the manufacturer of the computing components (222a, 222b, 222c, 222d) may determine that inlet air flow temperature for computing components (222a, 222b, 222c, 222d) in the data center (218) can be up to 95 degrees Fahrenheit for up to 500 hours per year without voiding the warranty for the computing components (222a, 222b, 222c, 222d). In such an example, the excursion information will indicate that inlet air flow temperature for computing components (222a, 222b, 222c, 222d) can be up to 95 degrees Fahrenheit for up to 500 hours per year.

The free cooling maximization module (206) of FIG. 1 is also configured to determine a free air cooling schedule in dependence upon the predictive weather information, the predetermined target inlet air flow temperature for computing components (222a, 222b, 222c, 222d) in the data center (218), and the excursion information. The free air cooling schedule of FIG. 1 specifies periods of time during which cooling is provided with free air. Determining a free air cooling schedule may be carried out, for example, by scheduling the computing components (222a, 222b, 222c, 222d) in the data center (218) to be cooled by free air cooling techniques at all times that the predictive weather information indicates that the expected air temperature is below the predetermined target inlet air flow temperature for computing components (222a, 222b, 222c, 222d) in the data center (218). Because the predictive weather information indicates that the expected air temperature is below the predetermined target inlet air flow temperature for computing components (222a, 222b, 222c, 222d) in the data center (218), air that is external to the data center (218) can be drawn into the data center (218) to cool the computing components (218) without using power consuming air sources such as an HVAC system.

Determining a free air cooling schedule may also be carried out by scheduling the computing components (222a, 222b, 222c, 222d) in the data center (218) to be cooled by free air cooling techniques in such as way as to maximize the use of excursion periods. For example, computing components (222a, 222b, 222c, 222d) may be scheduled for cooling using free air techniques when the predictive weather information indicates that the expected air temperature is above the predetermined target inlet air flow temperature for computing components (222a, 222b, 222c, 222d) in the data center (218) for a period of time that is equal to an amount of time identified in excursion information.

Also stored in RAM (168) is an operating system (154). Operating systems useful optimizing free cooling of data centers through weather-based intelligent control according to embodiments of the present invention include UNIX™, Linux™, Microsoft XP™, AIX™, IBM's i5/OS™, and others as will occur to those of skill in the art. The operating system (154) and free cooling maximization module (206) in the example of FIG. 1 are shown in RAM (168), but many components of such software typically are stored in non-volatile memory also, such as, for example, on a disk drive (170).

The computer (152) of FIG. 1 includes disk drive adapter (172) coupled through expansion bus (160) and bus adapter (158) to processor (156) and other components of the computer (152). Disk drive adapter (172) connects non-volatile data storage to the computer (152) in the form of disk drive (170). Disk drive adapters useful in computers for optimizing free cooling of data centers through weather-based intelligent control according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computer (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computer (152) of FIG. 1 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The example computer (152) of FIG. 1 includes a communications adapter (167) for data communications with other computers (182) and for data communications with a data communications network (100). Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful for optimizing free cooling of data centers through weather-based intelligent control according to embodiments of the present invention include modems for wired dial-up communications, Ethernet (IEEE 802.3) adapters for wired data communications network communications, and 802.11 adapters for wireless data communications network communications.

Figure 2:
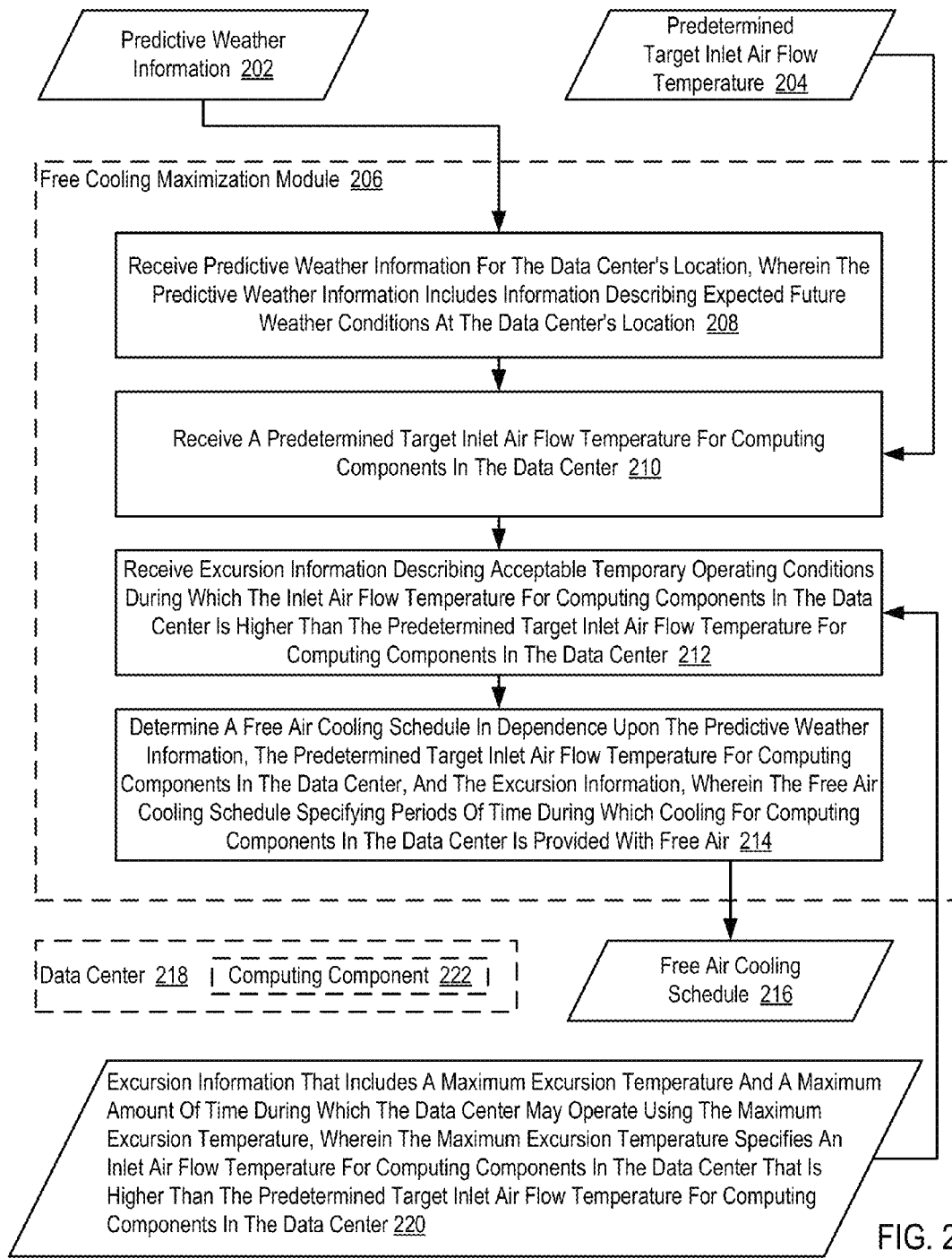

For further explanation, FIG. 2 sets forth a flow chart illustrating an example method for optimizing free cooling of data centers through weather-based intelligent control according to embodiments of the present invention. The example method of FIG. 2 includes receiving (208), by a free cooling maximization module (206), predictive weather information (202) for the data center's location. The free cooling maximization module (206) of FIG. 2 may be embodied as a module of computer program instructions that, when executed, optimizes free cooling of data centers through weather-based intelligent control according to embodiments of the present invention.

'Free cooling,' as the term in used here, refers to cooling techniques in which low external air temperatures are used to assist in cooling operations. That is, rather than using electrically powered air conditioning systems exclusively, free cooling techniques make use of cool air outside of a data center (218) to cool computing components (222) within the data center (218). Free cooling technologies can use water-side economizers in which water is cooled by cool air outside of a data center (218) and used in air conditioning efforts inside the data center (218). Free cooling technologies can also use air-side economizers in which cool air outside of a data center (218) is used in air conditioning efforts inside the data center (218).

In the example method of FIG. 2, the predictive weather information (202) includes information describing expected future weather conditions at the location of the data center (218). The predictive weather information (202) may include, for example, the expected temperature at various points in time at the location of the data center (218), the expected humidity level at various points in time at the location of the data center (218), and so on. The predictive weather information (202) of FIG. 2 may be embodied, for example, as a weather forecast for the data center's location. The weather forecast for the data center's location may include information describing expected weather conditions over a period of time, where the expected weather conditions over a period of time are generated using meteorological techniques. The predictive weather information (202) of FIG. 2 may alternatively be embodied as historical weather data for the data center's location. The historical weather data for the data center's location may include information such as the average temperature on a particular date in past years, the range of temperatures on a particular date in past years, and so on. The historical weather data for the data center's location may be useful as an indicator of expected future weather conditions at the location of the data center (218).

The example method of FIG. 2 also includes receiving (210), by the free cooling maximization module (206), a predetermined target inlet air flow temperature (204) for computing components (222) in the data center (218). The predetermined target inlet air flow temperature (204) for computing components (222) in the data center (218) may be received from a manufacturer of the computing components (222). The predetermined target inlet air flow temperature (204) for computing components (222) in the data center (218) represents an ideal temperature of air that will be introduced into the data center (218) to cool the computing components (222). Air may be introduced into the data center (218) to cool the computing components (222), for example, through the use of an HVAC system.

The example method of FIG. 2 also includes receiving (212), by the free cooling maximization module (206), excursion information (220). The excursion information (220) of FIG. 2 is information describing acceptable temporary operating conditions during which the inlet air flow temperature for computing components (222) in the data center (218) is higher than the predetermined target inlet air flow temperature (204) for computing components (222) in the data center (218). Consider an example in which the predetermined target inlet air flow temperature (204) for computing components (222) in the data center (218) is 70 degrees Fahrenheit. In such an example, the manufacturer of the computing components (222) may determine that inlet air flow temperature (204) for computing components (222) in the data center (218) can be up to 95 degrees Fahrenheit for up to 500 hours per year without voiding the warranty for the computing components (222). In such an example, the excursion information (220) will indicate that inlet air flow temperature (204) for computing components (222) can be up to 95 degrees Fahrenheit for up to 500 hours per year. In such an example, the excursion information (220) includes a maximum excursion temperature and a maximum amount of time during which the data center may operate using the maximum excursion temperature that specifies an inlet air flow temperature for computing components (222) in the data center (218) that is higher than the predetermined target inlet air flow temperature (204).

The example method of FIG. 2 also includes determining (214), by the free cooling maximization module (206), a free air cooling schedule (216) in dependence upon the predictive weather information (202), the predetermined target inlet air flow temperature (204) for computing components (222) in the data center (218), and the excursion information (220). The free air cooling schedule (216) of FIG. 2 specifies periods of time during which cooling is provided with free air. As described above, free cooling refers to cooling techniques in which low external air temperatures are used to assist in cooling operations. That is, rather than using electrically powered air conditioning systems exclusively, free cooling techniques make use of cool air outside of a data center (218) to cool computing components (222) within the data center (218).

In the example method of FIG. 2, determining (214) a free air cooling schedule (216) may therefore be carried out by scheduling the computing components (222) in the data center (218) to be cooled by free air cooling techniques at all times that the predictive weather information (202) indicates that the expected air temperature is below the predetermined target inlet air flow temperature (204) for computing components (222) in the data center (218). Because the predictive weather information (202) indicates that the expected air temperature is below the predetermined target inlet air flow temperature (204) for computing components (222) in the data center (218), air that is external to the data center (218) can be drawn into the data center (218) to cool the computing components (218) without using power consuming air sources such as an HVAC system.

In the example method of FIG. 2, determining (214) a free air cooling schedule (216) may also be carried out by scheduling the computing components (222) in the data center (218) to be cooled by free air cooling techniques in such as way as to maximize the use of excursion periods. For example, computing components (222) may be scheduled for cooling using free air techniques when the predictive weather information (202) indicates that the expected air temperature is above the predetermined target inlet air flow temperature (204) for computing components (222) in the data center (218) for a period of time that is equal to an amount of time identified in excursion information (220).

Consider an example in which the predetermined target inlet air flow temperature (204) for a computing component (222) is 70 degrees Fahrenheit and excursion information (220) indicates that the inlet air flow temperature (204) for a computing component (222) may be up to 75 degrees Fahrenheit for 1 hour in every 4 hour period. In such an example, assume that the predictive weather information (202) indicates the following forecast:

TABLE 1

Predictive Weather Information

| Time Period (in hours) | Expected Outside Temp. (° F.) |
|---|---|
| 0-1 | 64 |
| 1-2 | 68 |
| 2-3 | 72 |
| 3-4 | 76 |

According to the predictive weather information of Table 1, the expected air temperature outside of the data center (218) is 64 degrees Fahrenheit during the first hour specified in the predictive weather information (202), the expected air temperature outside of the data center (218) is 68 degrees Fahrenheit during the second hour specified in the predictive weather information (202), the expected air temperature outside of the data center (218) is 72 degrees Fahrenheit during the third hour specified in the predictive weather information (202), and the expected air temperature outside of the data center (218) is 76 degrees Fahrenheit during the fourth hour specified in the predictive weather information (202). In such an example, air outside of the data center (218) can be used to cool computing components (222) within the data center (218) for the first two hours specified in the predictive weather information (202), as the temperature of the air outside of the data center (218) is lower than the predetermined target inlet air flow temperature (204) for the computing component (222) during these time periods.

In the last two hours specified in the predictive weather information (202) of this example, the temperature of the air outside of the data center (218) is higher than the predetermined target inlet air flow temperature (204) for the computing component (222) during these time periods. Because excursion information (220) indicates that the inlet air flow temperature (204) for a computing component (222) may be up to 75 degrees Fahrenheit for 1 hour in every 4 hour period, however, free air cooling techniques could be used to cool computing components (222) within the data center (218) during the third hour specified in the predictive weather information (202) because the temperature of the air outside of the data center (218) is lower than the maximum air flow inlet temperature specified in the excursion information (220) during this time period. During the fourth hour specified in the predictive weather information (202), more expensive cooling techniques such as air flow from an HVAC system would need to be used as all excursions have been utilized and free cooling techniques do not provide adequate cooling.

Figure 3:
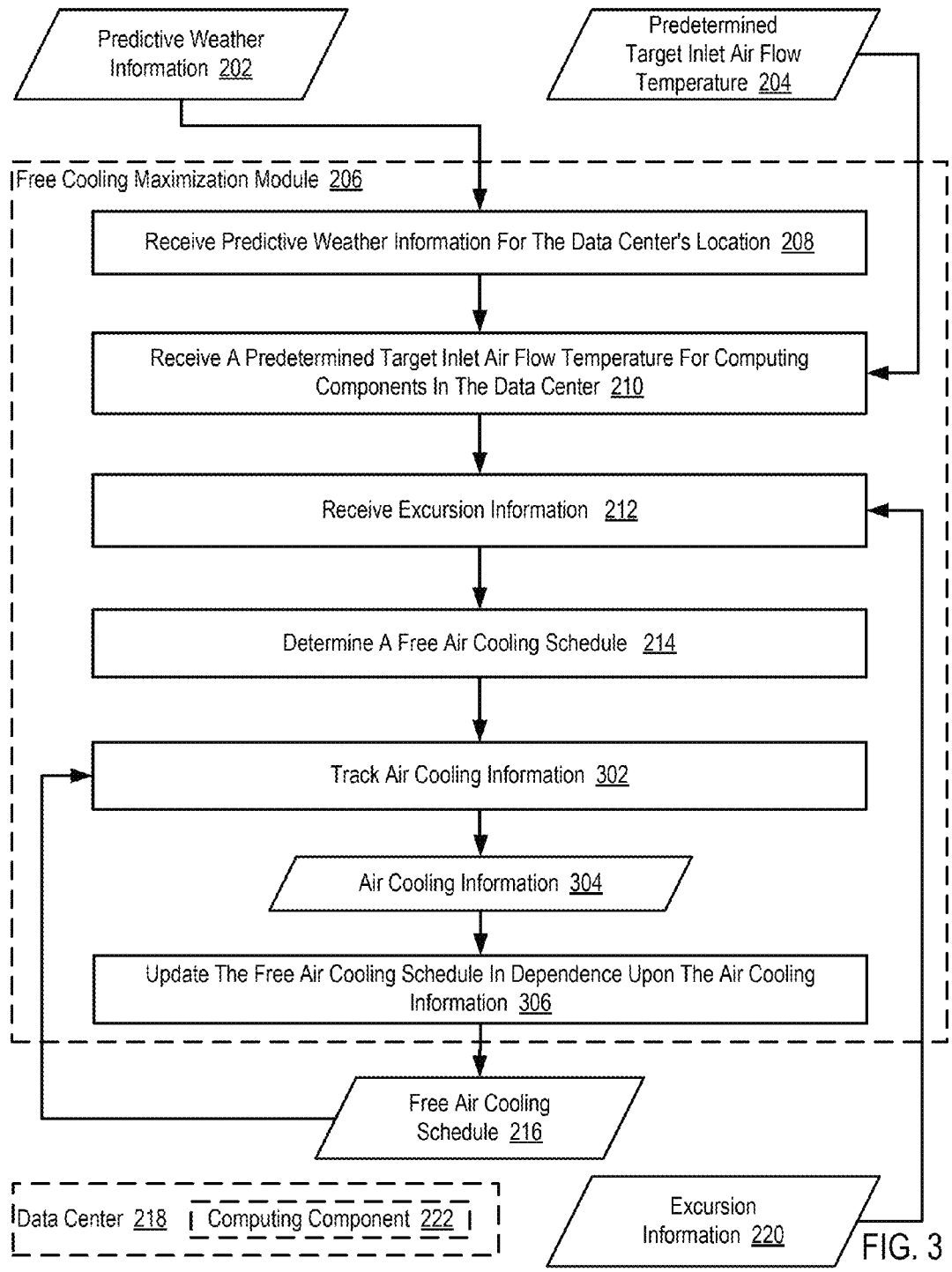

For further explanation, FIG. 3 sets forth a flow chart illustrating a further example method for optimizing free cooling of data centers through weather-based intelligent control according to embodiments of the present invention. The example method of FIG. 3 is similar to the example method of FIG. 2 as it also includes receiving (208) predictive weather information (202) for the data center's location, receiving (210) a predetermined target inlet air flow temperature (204) for computing components (222) in the data center (218), receiving (212) excursion information (220), and determining (214) a free air cooling schedule (216).

The example method of FIG. 3 also includes tracking (302), by the free cooling maximization module (206), air cooling information (304). In the example method of FIG. 3, tracking (302) air cooling information (304) can be carried out by storing information in a data repository that describes actual, rather than predictive, aspects of cooling operations in the data center (218). Such air cooling information (304) can include, for example, the amount of time during which the inlet air flow temperature for computing components (222) in the data center (218) is higher than the predetermined target inlet air flow temperature (204) for computing components (222) in the data center (218). The air cooling information (304) can also include, for example, the amount of time during which the inlet air flow temperature for computing components (222) in the data center (218) is lower than or equal to the predetermined target inlet air flow temperature (204) for computing components (222) in the data center (218).

The example method of FIG. 3 also includes updating (306) the free air cooling schedule (216) in dependence upon the air cooling information (304). Consider the example described above with reference to Table 1. In the example described above, free air cooling techniques were scheduled to be used during the first three hours specified in the predictive weather information (202). During the first two hours specified in the predictive weather information (202), free air cooling techniques could be used because the temperature of the air outside of the data center (218) was lower than the predetermined target inlet air flow temperature (204) for the computing component (222) during these time periods. During the third hour specified in the predictive weather information (202), free air cooling techniques could be used because an excursion period was available for use.

Consider an example in which actual air temperature outside of the data center (218) during the third hour specified in the predictive weather information (202), however, was only been 69 degrees. Because free air cooling techniques were scheduled to be used during the third hour specified in the predictive weather information (202), using free air cooling techniques during this period would not have caused any of the excursion period to be consumed because the actual inlet air flow temperatures were below the predetermined target inlet air flow temperature (204). As such, the air cooling information (304) could be used to update (306) the free air cooling schedule (216) by altering the free air cooling schedule (216) such that free air cooling techniques are utilized during the fourth hour specified in the predictive weather information (202). Free air cooling techniques could be utilized during this period because the one hour excursion period identified in the excursion information (220) was still available for use.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of optimizing free cooling of data centers through weather-based intelligent control, the method comprising:

receiving, by a free cooling maximization module, predictive weather information for the data center's location, wherein the predictive weather information includes information describing expected future weather conditions at the data center's location;

receiving, by the free cooling maximization module, a predetermined target inlet air flow temperature for computing components in the data center;

receiving, by the free cooling maximization module, excursion information describing acceptable temporary operating conditions during which the inlet air flow temperature for computing components in the data center is higher than the predetermined target inlet air flow temperature for computing components in the data center, wherein the excursion information includes a maximum excursion temperature and a maximum amount of time during which the data center may operate using the maximum excursion temperature, wherein the maximum excursion temperature specifies an inlet air flow temperature for computing components in the data center that is higher than the predetermined target inlet air flow temperature for computing components in the data center;

determining, by the free cooling maximization module, a free air cooling schedule in dependence upon the predictive weather information, the predetermined target inlet air flow temperature for computing components in the data center, and the excursion information, wherein the free air cooling schedule specifies periods of time during which cooling for computing components in the data center is provided with free air external to the data center and drawn into the data center at a temperature higher than the predetermined target inlet air flow temperature; and determining, by the free cooling maximization module, periods of time in the free air cooling schedule during which cooling for computing components in the data center is provided with HVAC, wherein the periods of time in the free air cooling schedule during which cooling is provided with HVAC are scheduled after all the periods of time during which cooling for computing components in the data center is provided with free air external to the data center and drawn into the data center at a temperature higher than the predetermined target inlet air flow temperature have been utilized, wherein the free air cooling schedule includes periods of time during which cooling for computing components in the data center is provided with free air external to the data center and drawn into the data center at a temperature higher than the predetermined target inlet air flow temperature and periods of time during which cooling for computing components in the data center is provided with HVAC in order to ensure adequate cooling with reduced electricity consumption.

2. The method of claim 1 further comprising tracking, by the free cooling maximization module, air cooling information that includes:

the amount of time during which the inlet air flow temperature for computing components in the data center is higher than the predetermined target inlet air flow temperature for computing components in the data center; and the amount of time during which the inlet air flow temperature for computing components in the data center is lower than or equal to the predetermined target inlet air flow temperature for computing components in the data center.

3. The method of claim 2 further comprising updating the free air cooling schedule in dependence upon the air cooling information.

4. The method of claim 1 wherein the predictive weather information includes a weather forecast for the data center's location.

5. The method of claim 1 wherein the predictive weather information includes historical weather data for the data center's location.

6. An apparatus for optimizing free cooling of data centers through weather-based intelligent control, the apparatus comprising a computer processor, a computer memory operatively coupled to the computer processor, the computer memory having disposed within it computer program instructions that, when executed by the computer processor, cause the apparatus to carry out the steps of:

receiving, by a free cooling maximization module, predictive weather information for the data center's location, wherein the predictive weather information includes information describing expected future weather conditions at the data center's location;

receiving, by the free cooling maximization module, a predetermined target inlet air flow temperature for computing components in the data center;

receiving, by the free cooling maximization module, excursion information describing acceptable temporary operating conditions during which the inlet air flow temperature for computing components in the data center is higher than the predetermined target inlet air flow temperature for computing components in the data center, wherein the excursion information includes a maximum excursion temperature and a maximum amount of time during which the data center may operate using the maximum excursion temperature, wherein the maximum excursion temperature specifies an inlet air flow temperature for computing components in the data center that is higher than the predetermined target inlet air flow temperature for computing components in the data center;

determining, by the free cooling maximization module, a free air cooling schedule in dependence upon the predictive weather information, the predetermined target inlet air flow temperature for computing components in the data center, and the excursion information, wherein the free air cooling schedule specifies periods of time during which cooling for computing components in the data center is provided with free air external to the data center and drawn into the data center at a temperature higher than the predetermined target inlet air flow temperature; and determining, by the free cooling maximization module, periods of time in the free air cooling schedule during which cooling for computing components in the data center is provided with HVAC, wherein the periods of time in the free air cooling schedule during which cooling is provided with HVAC are scheduled after all the periods of time during which cooling for computing components in the data center is provided with free air external to the data center and drawn into the data center at a temperature higher than the predetermined target inlet air flow temperature have been utilized, wherein the free air cooling schedule includes periods of time during which cooling for computing components in the data center is provided with free air external to the data center and drawn into the data center at a temperature higher than the predetermined target inlet air flow temperature and periods of time during which cooling for computing components in the data center is provided with HVAC in order to ensure adequate cooling with reduced electricity consumption.

7. The apparatus of claim 6 further comprising computer program instructions that, when executed by the computer processor, cause the apparatus to carry out the step of tracking, by the free cooling maximization module, air cooling information that includes:

the amount of time during which the inlet air flow temperature for computing components in the data center is higher than the predetermined target inlet air flow temperature for computing components in the data center; and the amount of time during which the inlet air flow temperature for computing components in the data center is lower than or equal to the predetermined target inlet air flow temperature for computing components in the data center.

8. The apparatus of claim 7 further comprising computer program instructions that, when executed by the computer processor, cause the apparatus to carry out the step of updating the free air cooling schedule in dependence upon the air cooling information.

9. The apparatus of claim 6 wherein the predictive weather information includes a weather forecast for the data center's location.

10. The apparatus of claim 6 wherein the predictive weather information includes historical weather data for the data center's location.

11. A computer program product for optimizing free cooling of data centers through weather-based intelligent control, the computer program product disposed upon a computer readable medium, wherein the computer program product is not a signal, the computer program product comprising computer program instructions that, when executed, cause a computer to carry out the steps of:

receiving, by a free cooling maximization module, predictive weather information for the data center's location, wherein the predictive weather information includes information describing expected future weather conditions at the data center's location;

receiving, by the free cooling maximization module, a predetermined target inlet air flow temperature for computing components in the data center;

receiving, by the free cooling maximization module, excursion information describing acceptable temporary operating conditions during which the inlet air flow temperature for computing components in the data center is higher than the predetermined target inlet air flow temperature for computing components in the data center, wherein the excursion information includes a maximum excursion temperature and a maximum amount of time during which the data center may operate using the maximum excursion temperature, wherein the maximum excursion temperature specifies an inlet air flow temperature for computing components in the data center that is higher than the predetermined target inlet air flow temperature for computing components in the data center;

determining, by the free cooling maximization module, a free air cooling schedule in dependence upon the predictive weather information, the predetermined target inlet air flow temperature for computing components in the data center, and the excursion information, wherein the free air cooling schedule specifies periods of time during which cooling for computing components in the data center is provided with free air external to the data center and drawn into the data center at a temperature higher than the predetermined target inlet air flow temperature; and determining, by the free cooling maximization module, periods of time in the free air cooling schedule during which cooling for computing components in the data center is provided with HVAC, wherein the periods of time in the free air cooling schedule during which cooling is provided with HVAC are scheduled after all the periods of time during which cooling for computing components in the data center is provided with free air external to the data center and drawn into the data center at a temperature higher than the predetermined target inlet air flow temperature have been utilized, wherein the free air cooling schedule includes periods of time during which cooling for computing components in the data center is provided with free air external to the data center and drawn into the data center at a temperature higher than the predetermined target inlet air flow temperature and periods of time during which cooling for computing components in the data center is provided with HVAC in order to ensure adequate cooling with reduced electricity consumption.

12. The computer program product of claim 11 further comprising computer program instructions that, when executed, cause a computer to carry out the step of tracking, by the free cooling maximization module, air cooling information that includes:

the amount of time during which the inlet air flow temperature for computing components in the data center is higher than the predetermined target inlet air flow temperature for computing components in the data center; and the amount of time during which the inlet air flow temperature for computing components in the data center is lower than or equal to the predetermined target inlet air flow temperature for computing components in the data center.

13. The computer program product of claim 12 further comprising computer program instructions that, when executed, cause a computer to carry out the step of updating the free air cooling schedule in dependence upon the air cooling information.

14. The computer program product of claim 11 wherein the predictive weather information includes a weather forecast for the data center's location.

15. The computer program product of claim 11 wherein the predictive weather information includes historical weather data for the data center's location.

16. The computer program product of claim 11 wherein the computer readable medium further comprises a computer readable storage medium.

* * * * *